(12) United States Patent
Koujima et al.

(10) Patent No.: US 11,551,851 B2
(45) Date of Patent: Jan. 10, 2023

(54) MODULE SUBSTRATE ANTENNA, AND MODULE SUBSTRATE MOUNTING THE SAME

(71) Applicants: TODA KOGYO CORP., Hiroshima (JP); Securitag Assembly Group Co., Ltd., Taichung (TW)

(72) Inventors: Jun Koujima, Hiroshima (JP); Mark Chang, Taichung (TW); Yoshiteru Kouno, Hiroshima (JP); Peter Yan, Taichung (TW)

(73) Assignees: TODA KOGYO CORP., Hiroshima (JP); SECURITAG ASSEMBLY GROUP CO., LTD., Taichung (TW)

( * ) Notice: Subject to any disclaimer, the term of this patent is extended or adjusted under 35 U.S.C. 154(b) by 958 days.

(21) Appl. No.: 16/367,787

(22) Filed: Mar. 28, 2019

(65) Prior Publication Data

US 2019/0304662 A1    Oct. 3, 2019

(30) Foreign Application Priority Data

Mar. 30, 2018   (JP) .............. JP2018-068276

(51) Int. Cl.
| | |
|---|---|
| H01F 27/28 | (2006.01) |
| H01F 17/00 | (2006.01) |
| H01F 27/29 | (2006.01) |
| H05K 1/02 | (2006.01) |
| H05K 1/16 | (2006.01) |
| H05K 1/18 | (2006.01) |
| H01Q 7/06 | (2006.01) |

(52) U.S. Cl.
CPC ..... *H01F 27/2804* (2013.01); *H01F 17/0013* (2013.01); *H01F 27/292* (2013.01); *H01Q 7/06* (2013.01); *H05K 1/02* (2013.01); *H05K 1/162* (2013.01); *H05K 1/165* (2013.01); *H05K 1/18* (2013.01); *H01F 17/0033* (2013.01); *H01F 2017/0026* (2013.01); *H01F 2027/2809* (2013.01)

(58) Field of Classification Search
CPC ............ H01F 27/2804; H01F 17/0013; H01F 27/292; H01F 17/0033; H01F 2017/0026; H01Q 7/06; H05K 1/02; H05K 1/165; H05K 1/18
See application file for complete search history.

(56) References Cited

U.S. PATENT DOCUMENTS

2016/0240918 A1* 8/2016 Yoon .................... H04B 1/0458
2017/0011838 A1   1/2017 Asada

FOREIGN PATENT DOCUMENTS

JP   2012059015 A  *  3/2012
WO   WO 2015/152333 A1    4/2017

* cited by examiner

*Primary Examiner* — Dinh T Le
(74) *Attorney, Agent, or Firm* — Alston & Bird LLP

(57) ABSTRACT

A module substrate antenna includes: a laminate in which a plurality of ferrite layers are stacked; antennal coils provided on surfaces of the respective ferrite layers; a connection pad connected to an external circuit; and a lead wire provided between the laminate and the connection pad. In the laminate, the antenna coils are two types of the antenna coils, and the two types of the antenna coils are alternately stacked.

6 Claims, 4 Drawing Sheets

MODULE SUBSTRATE ANTENNA, AND MODULE SUBSTRATE MOUNTING THE SAME

CROSS REFERENCE TO RELATED APPLICATION

This application claims priority to and the benefit of Japanese Patent Application No. 2018-068276, filed on Mar. 30, 2018; the entire disclosure of which as is incorporated by reference herein.

BACKGROUND

The present invention relates to antennas for IC module substrates mounting, e.g., integrated circuit (IC) chips thereon, and functioning as wireless communication modules.

Recently, widespread use of IC modules (noncontact IC tags or IC cards) receiving and transmitting signals in a noncontact manner has been started. This IC module includes antenna wiring in which conductive wires are formed on the surface of an insulation substrate. This antennal wiring allows for receiving and transmitting signals in a noncontact manner.

For example, WO 2015/152333 discloses a module substrate including: a laminate in which a plurality of insulating layers formed of a non-magnetic material made of non-magnetic ferrite such as Cu—Zn-based are stacked; and a pattern conductor provided on the surface of each of the insulating layers and made of a conductive material such as Ag.

BRIEF SUMMARY

However, in a situation where the module substrate disclosed in WO 2015/152333 is connected to an external circuit after mounting, e.g., IC chips thereon, the fluctuation of the inductance of the antenna coil is increased. Thus, a capacitor for adjusting the frequency of the antenna coil on, e.g., the surface in which the IC chips are mounded has to be provided independently, thereby causing difficulty in adjusting the frequency, which poses a problem.

In view of the foregoing background, it is therefore an object of the present invention to provide a module substrate capable of easily adjusting the frequency of an antenna coil.

In order to attain the above object, the module substrate antenna of the present invention includes: a laminate in which a plurality of ferrite layers are stacked; antennal coils provided on surfaces of the respective ferrite layers; a connection pad connected to an external circuit; and a lead wire provided between the laminate and the connection pad. In the laminate, the antenna coils are two types of the antenna coils, and the two types of the antenna coils alternately stacked.

According to the module substrate antenna of the present invention, the module substrate antenna mounting IC chips thereon can easily adjust the frequency of the antenna coil before the module substrate is connected to an external circuit. As a result, in connecting the module substrate to the external circuit, it is unnecessary to adjust the frequency by, e.g., a capacitor for adjusting frequency.

DETAILED DESCRIPTION OF VARIOUS EMBODIMENTS

Embodiments of the present invention will now be described in detail with reference to the drawings.

First Embodiment

Figure 1:
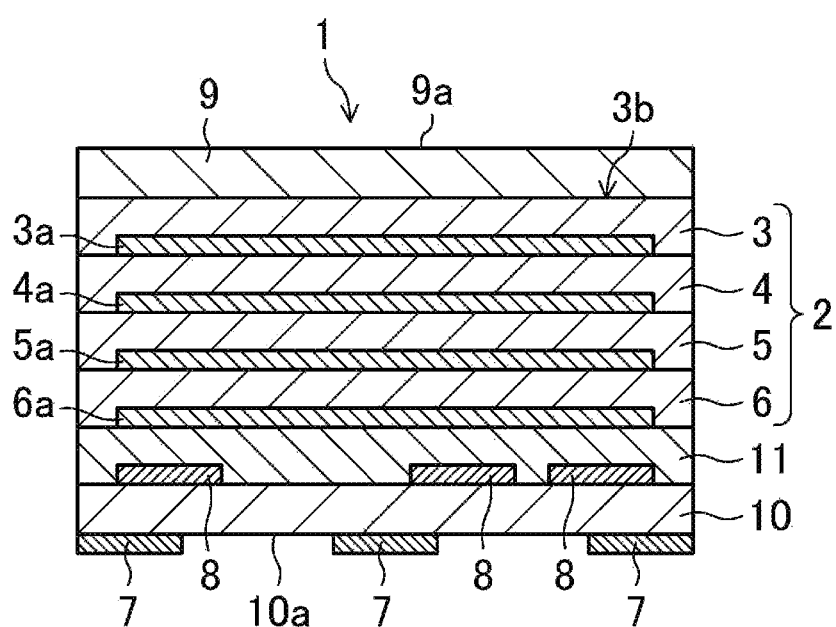
FIG. 1 is a cross-sectional view of a module substrate according to a first embodiment of the present invention.
Figure 2:
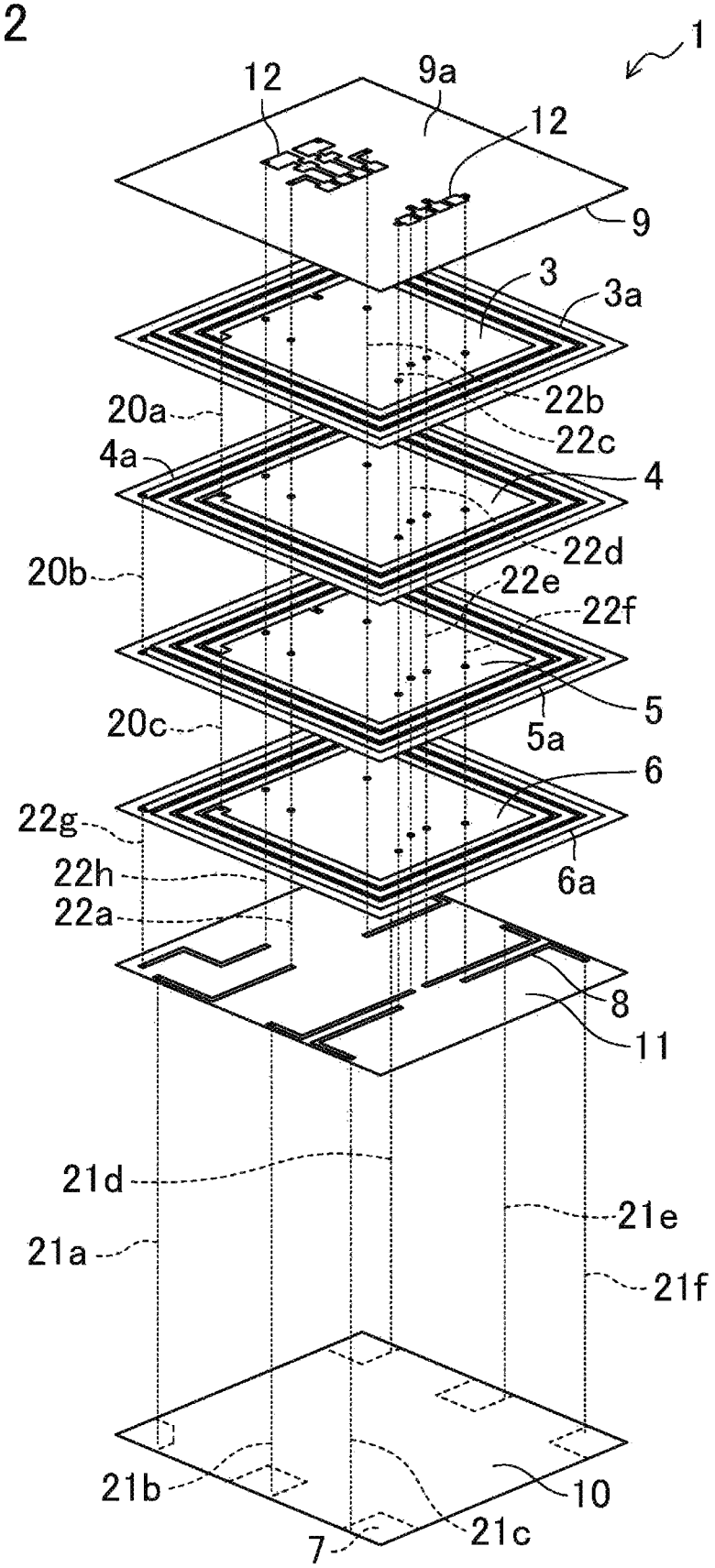
FIG. 2 is an exploded perspective view of the module substrate according to the first embodiment of the present invention.

FIG. 1 is a cross-sectional view of a module substrate according to this embodiment. FIG. 2 is an exploded perspective view of the module substrate according to this embodiment.

As illustrated in FIG. 1, the module substrate 1 includes: a laminate 2 in which a plurality (four layers in this embodiment) of ferrite layers 3 to 6 are stacked; antenna coils 3a to 6a provided on surfaces of the respective ferrite layers 3 to 6; a connection pad 7 connected to an external circuit (not illustrated); and a lead wire 8 provided between the laminate 2 and the connection pad 7.

The ferrite layers 3 to 6 are made of a non-magnetic material such as non-magnetic ferrite. These ferrite layers 3 to 6 are stacked to form the laminate 2.

For example, a Zn-based ferrite powder can be used as a main component of the non-magnetic ferrite. The components are preferably included with the following composition ratio: $Fe_2O_3$:$ZnO$:$CuO$=40.0-50.0 mol %: 35.0-50.0 mol %: 5-20.0 mol %.

The thickness of each of the ferrite layers 3 to 6 is preferably, but is not limited to, 50-100 μm in terms of a multilayer ceramic method.

The antenna coils 3a to 6a are made of a conductive material, and form a spiral antenna pattern in a rectangular manner.

The ferrite layers 3 to 6 are provided with interlayer connection conductors 20a to 20c passing through the ferrite layers 3 to 6 in the thickness direction. The antenna coils 3a to 6a are electrically connected together through the interlayer connection conductors 20a to 20c. In the module substrate 1 of this embodiment, the antenna coils 3a to 6a and the interlayer connection conductors 20a to 20c electrically connect the whole of the antenna coils 3a to 6a together, thereby forming the antenna coils 3a to 6a functioning as the antenna.

The materials for forming the antenna coils 3a to 6a and the interlayer connection conductors 20a to 20c are not particularly limited, and silver and copper can be used, for example.

Also, as illustrated in FIGS. 1 and 2, an IC mounted surface 3b of the ferrite layer 3 that is the uppermost layer in the laminate 2 is provided with an insulating layer 9 for mounting ICs. An outer surface 9a of the insulating layer 9 is provided with an electrode 12 for mounting ICs. As well as the above ferrite layers 3 to 6, the insulating layer 9 can be made of a non-magnetic material such as non-magnetic ferrite.

Also, as illustrated in FIGS. 1 and 2, the ferrite layer 6 that is the lowermost layer in the laminate 2 is provided with an insulating layer 10 for mounting connection pads. An outer surface 10a of the insulating layer 10 is provided with the connection pad 7 connected to an external circuit. As well as the above ferrite layers 3 to 6, the insulating layer 10 can be made of a non-magnetic material such as non-magnetic ferrite.

Examples of the material for forming the connection pad 7 can include Ag, Cu, and alloys such as Ag—Pt alloy, and Ag—Pd alloy.

Also, as illustrated in FIGS. 1 and 2, an insulating layer 11 for lead wires is provided between the laminate 2 and the insulating layer 10 for mounting a connection pad. The lead wire 8 is provided on the surface of the insulating layer 11. As well as the above ferrite layers 3 to 6, the insulating layer 11 can be made of a non-magnetic material such as non-magnetic ferrite.

The material for forming the lead wire 8 is not particularly limited, and the materials for forming the above-described antenna coils 3a to 6a can be used, for example.

This embodiment is, as illustrated in FIG. 2, characterized in that, in the laminate 2, the antenna coils 3a to 6a, two of which have the same antenna pattern (spiral pattern), and the other two of which have another same antenna pattern (spiral pattern), are alternately stacked.

More specifically, as illustrated in FIG. 2, the antenna coils 3a and 5a have the same rectangular spiral pattern, and the antenna coils 4a and 6a have the same rectangular spiral pattern. In the laminate 2, two types of the antenna coils having the different spiral patterns are alternately stacked (that is to say, the layers are stacked such that the adjacent spiral patterns in the thickness direction of the laminate 2 are different from each other).

The above configuration allows for reducing the fluctuation of the inductance of each of the antenna coils 3a to 6a, thereby making it possible to easily adjust the frequency of the antenna comprised of the antenna coils 3a to 6a before the module substrate 1 mounting IC chips (not illustrated) thereon is connected to an external circuit. Also, it is unnecessary to adjust the frequency by a capacitor for adjusting the frequency. This eliminates the necessity of the capacitor.

In this embodiment, as illustrated in FIG. 2, the connection pad 7 is connected to, through the lead wire 8, the electrode 12 for mounting ICs provided on the outer surface 9a of the insulating layer 9, and the connection pad 7 is provided so as to be exposed (i.e., from the outer surface 10a of the insulating layer 10) in a position opposite to the outer surface 9a of the insulating layer 9.

Accordingly, this allows for easily connecting the module substrate 1 to an external circuit by, e.g., soldering.

Also, the insulating layers 10 and 11 are provided with interlayer connection conductors 21a to 21f passing through the insulating layers 10 and 11 in the thickness direction. The connection pad 7 and the lead wire 8 are electrically connected together through the interlayer connection conductors 21a to 21f.

The ferrite layers 3 to 6, and the insulating layers 9 and 11 are provided with the interlayer connection conductors 22a to 22f passing through the ferrite layers 3 to 6 and the insulating layers 9 and 11 in the thickness direction. The lead wire 8 electrically connected to the connection pad 7 is electrically connected to the electrode 12 for mounting IC chips through the interlayer connection conductors 22a to 22f. In the module substrate 1 in this embodiment, such a configuration allows the lead wire 8 to electrically connect the connection pad 7 to the electrode 12 for mounting ICs provided adjacent to the IC mounted surface 3b of the ferrite layer 3 that is the uppermost layer in the laminate 2.

Also, as illustrated in FIG. 2, the connection pad 7 is connected only to the lead wire 8, not to the antenna coils 3a to 6a. Therefore, in a situation where the antenna coils are in communication with a communication reader, a signal output from an IC chip can be independently transmitted to the substrate.

Also, as illustrated in FIG. 2, the lead wire 8 is connected to the electrode 12 for mounting ICs through the internal portions of the antenna coils 3a to 6a of the ferrite layers 3 to 6. Accordingly, the lead wire 8 can be arranged such that the length of the lead wire 8 is reduced, thereby making it possible to reduce the size of the module substrate 1.

The antenna coil 6a is connected to the lead wire 8 through the interlayer connection conductor 22g, and this lead wire 8 is connected to the electrode 12 for mounting IC chips through the interlayer connection conductor 22h.

Electrically connecting the above-described connection pad 7 of the module substrate 1 to an external circuit mounting a semiconductor element thereon forms a module in which an antenna comprised of antenna coils 3a to 6a and the semiconductor element are electrically connected together. The signal received by the antenna is transmitted to the semiconductor element and processed. The signal transmitted from the semiconductor element is transmitted from the antenna to the outside.

Next, a method of manufacturing the module substrate will be described. First, a solvent is added to a mixture of the non-magnetic material, which is the material powder for the ferrite layers 3 to 6 and the insulating layers 9 to 11, and a binder, thereby forming a ferrite dispersing element.

Next, a green sheet with a non-magnetic layer is produced from this ferrite dispersing element using a well-known sheet formation method such as a doctor blade method, and is cut to have a desired shape.

Next, the interlayer connection conductors 20a to 20c, 21a to 21f, and 22a to 22h are formed on the individual green sheets. More specifically, first, through holes are drilled in the ceramic green sheets that are to be the ferrite layers 3 to 6 and insulating layers 9 to 11 by, e.g., a pin or laser beam. Next, a conductive paste containing, e.g., the above-described silver and copper as main components is prepared with respect to the through holes, and the through holes are filled with this conductive paste.

Next, the antenna coils 3a to 6a are respectively formed on the surfaces of the ceramic green sheets that are to be the ferrite layers 3 to 6. More specifically, a conductive paste containing, e.g., the above-described silver and copper as main components is coated on the surface of each of the ceramic green sheets by, e.g., a screen printing method to form the antenna coils 3a to 6a.

Next, in a similar manner to the method of forming the antenna coils 3a to 6a, the electrode 12 for mounting ICs, the connection pad 7, and the lead wire 8 are respectively formed on the surfaces of the ceramic green sheets that are to be the insulating layers 9 to 11.

Subsequently, the ceramic green sheets that are to be the ferrite layers 3 to 6 and the insulating layers 9 to 11 are stacked in the order shown in FIG. 2, and is pressurized by isostatic pressing to perform contact bonding (laminate treatment) to obtain a mother laminate. The mother laminate after contact bonding is cut to have a predetermined dimension. Then, the cut laminate is annealed to manufacture the module substrate 1 illustrated in FIG. 1.

Second Embodiment

Figure 3:
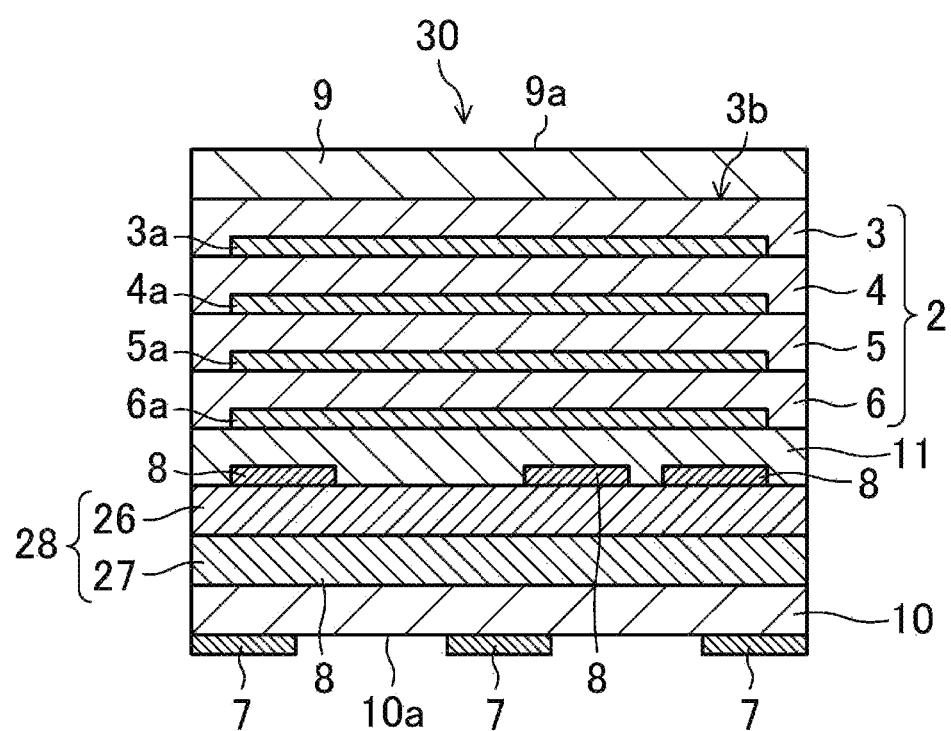
FIG. 3 is a cross-sectional view of a module substrate according to a second embodiment of the present invention.
Figure 4:
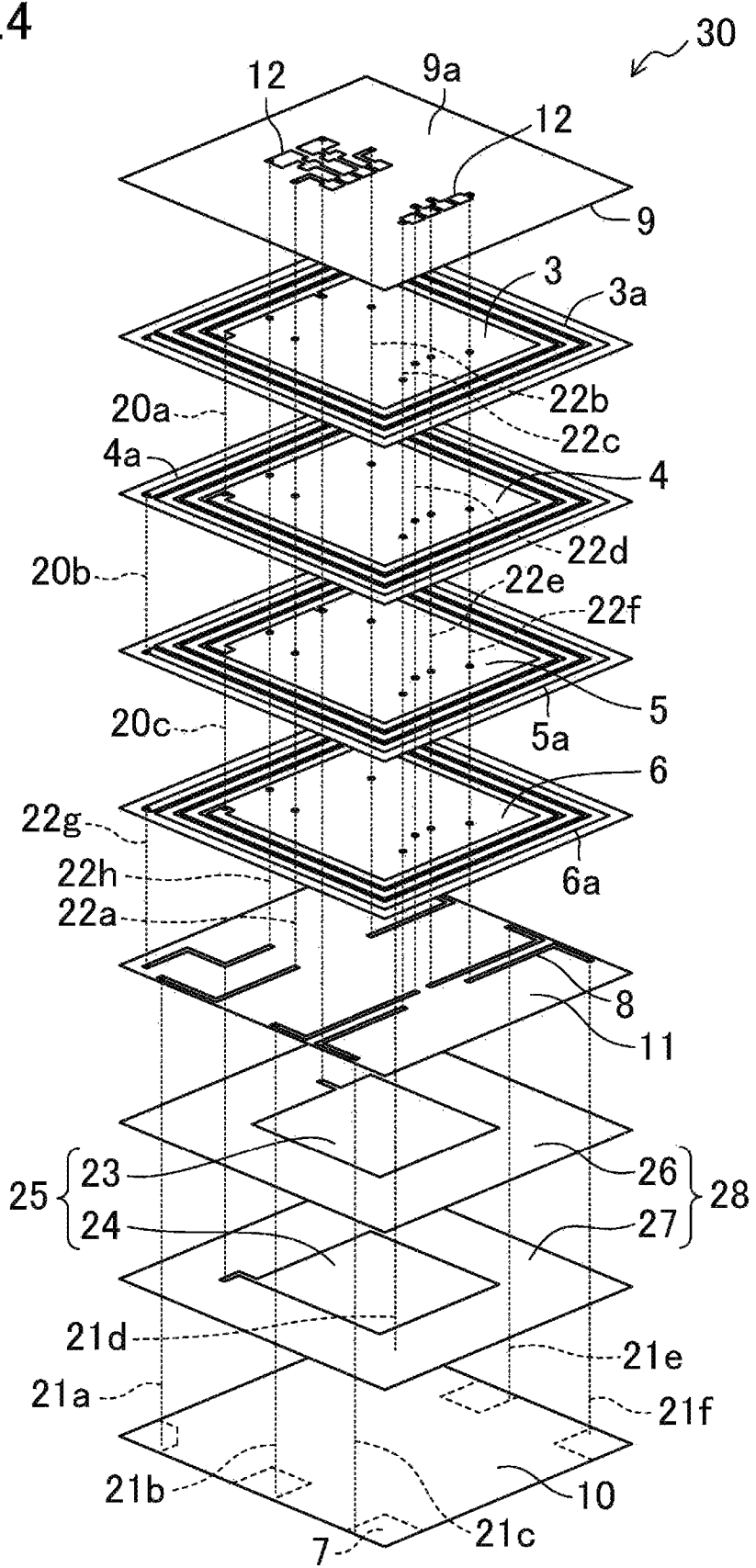
FIG. 4 is an exploded perspective view of the module substrate according to the second embodiment of the present invention.

A second embodiment of the present invention will now be described. FIG. 3 is a cross-sectional view of a module substrate according to the second embodiment of the present invention. FIG. 4 is an exploded perspective view of the module substrate according to the second embodiment of the present invention. The same reference numerals as those in the first embodiment are used to represent equivalent elements, and the detailed explanation thereof will be omitted.

As illustrated in FIGS. 3 and 4, in a module substrate 30 of this embodiment, a capacitor 25 comprised of a pair of electrodes 23 and 24 for capacitors between the connection pad 7 and the lead wire 8.

Providing such a capacitor 25 can perform fine adjustment of the frequency of each of the antenna coils 3a to 6a, thereby making it possible to further easily adjust the frequency of each of the antenna coils.

As illustrated in FIGS. 3 and 4, insulating layers 26 and 27 for capacitor electrodes are provided between the insulating layer 10 for mounting the connection pad and the insulating layer 11 for the lead wire. The surface of the insulating layer 26 is provided with an electrode 23 for a capacitor, and the surface of the insulating layer 27 is provided with an electrode 24 for a capacitor.

As well as the above ferrite layers 3 to 6, the insulating layers 26 and 27 can be made of a non-magnetic material such as non-magnetic ferrite or a magnetic material such as magnetic ferrite. Also, only one of the insulating layers 26 and 27 can be made of a non-magnetic material (or a magnetic material).

For example, a Ni—Zn-based ferrite powder can be used as a main component of the magnetic ferrite. The components are preferably included with the following composition ratio: $Fe_2O_3$:NiO:ZnO:CuO:CoO=46-50 mol %: 20-27 mol %: 15-22 mol %: 9-11 mol %:and 0-1.0 mol %.

The material for forming the electrodes 23 and 24 for capacitors is not particularly limited, and the metal materials for forming the above-described antenna coils 3a to 6a can be used, for example.

The electrodes 23 and 24 for capacitors can be formed by preparing a conductive paste containing, e.g., the above-described silver and copper as main components, and coating the conductive paste onto the surfaces of the insulating layers 26 and 27.

As illustrated in FIGS. 3 and 4, in the module substrate 30 of this embodiment, the capacitor 25 is connected in parallel to the antenna coils 3a to 6a. The capacitor 25 and the antenna coils 3a to 6a form an LC resonance circuit. The capacitor 25 is not connected to the connection pad 7.

That is to say, in the module substrate 30 of this embodiment, the capacitor 25 does not have a function as a single body (for example, a function of regulating a voltage), and only contributes to improving properties of the antenna coils 3a to 6a (that is to say, adjustment of frequency fin the LC resonance circuit).

The module substrate antenna of the present invention can be effectively used as a module substrate mounting IC chips, and having a built-in stack type coil component (a dynamic tag) functioning as the antenna for wireless communications.

What is claimed is:

1. A module substrate antenna, comprising:
   a laminate in which a plurality of ferrite layers are stacked;
   antennal coils provided on surfaces of the respective ferrite layers;
   a connection pad connected to an external circuit; and
   a lead wire provided between the laminate and the connection pad,
   wherein, in the laminate, the antenna coils are two types of the antenna coils, the two types of the antenna coils are alternately stacked, and the two types of the antenna coils have different antenna patterns.

2. The module substrate antenna of claim 1, wherein:
   the connection pad is connected to an electrode for mounting ICs provided in an IC mounted surface of the uppermost layer of the ferrite layers in the laminate through the lead wire, and
   the connection pad is exposed in a position opposite to the IC mounted surface.

3. The module substrate antenna of claim 2, wherein the lead wire is connected to the electrode for mounting ICs through internal portions of the antenna coils of the ferrite layers.

4. The module substrate antenna of claim 1, wherein a capacitor comprised of a pair of electrodes for capacitors is provided between the lead wire and the connection pad.

5. The module substrate antenna of claim 4, wherein:
   the capacitor is connected in parallel to the antenna coils, and
   the capacitor and the antenna coils form an LC resonance circuit.

6. A module substrate comprising the module substrate antenna of claim 1.

* * * * *